(12) United States Patent
Morikazu et al.

(10) Patent No.: US 9,305,793 B2
(45) Date of Patent: Apr. 5, 2016

(54) WAFER PROCESSING METHOD

(71) Applicant: Disco Corporation, Tokyo (JP)

(72) Inventors: Hiroshi Morikazu, Tokyo (JP); Noboru Takeda, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/188,896

(22) Filed: Feb. 25, 2014

(65) Prior Publication Data

US 2014/0256150 A1    Sep. 11, 2014

(30) Foreign Application Priority Data

Mar. 5, 2013 (JP) ................................. 2013-043219

(51) Int. Cl.
*H01L 21/302* (2006.01)
*H01L 21/306* (2006.01)
*H01L 21/263* (2006.01)

(52) U.S. Cl.
CPC ........ *H01L 21/30604* (2013.01); *H01L 21/263* (2013.01)

(58) Field of Classification Search
CPC ............ H01L 21/30604; H01L 21/363; B23K 26/0057; B23K 26/0626; B23K 26/385; B26F 3/00
USPC ....................................... 438/746; 216/37, 67
See application file for complete search history.

(56) References Cited

U.S. PATENT DOCUMENTS

| | | | |
|---|---|---|---|
| 5,486,264 A * | 1/1996 | Ghandour | ...................... 438/746 |
| 6,665,050 B2 * | 12/2003 | Shiraishi | .......................... 355/53 |
| 6,992,026 B2 | 1/2006 | Fukuyo et al. | |
| 2004/0002199 A1 | 1/2004 | Fukuyo et al. | |
| 2005/0272223 A1 | 12/2005 | Fujii et al. | |
| 2007/0004179 A1 | 1/2007 | Nakamura et al. | |
| 2009/0266802 A1 | 10/2009 | Sawabe et al. | |
| 2010/0136766 A1 * | 6/2010 | Sakamoto et al. | ............. 438/463 |
| 2013/0126573 A1 * | 5/2013 | Hosseini et al. | ................... 225/2 |
| 2014/0248757 A1 | 9/2014 | Morikazu et al. | |

FOREIGN PATENT DOCUMENTS

| | | |
|---|---|---|
| JP | 10-305420 | 11/1998 |
| JP | 2002-192370 | 7/2002 |
| JP | 2003-163323 | 6/2003 |
| JP | 2007-067082 | 3/2007 |
| JP | 2007-330985 | 12/2007 |

OTHER PUBLICATIONS

Berthold A, et al, Proceedings of the SeSens Workshop, (2010) pp. 613-616.*
U.S. Appl. No. 14/185,189, filed Feb. 20, 2014.

* cited by examiner

*Primary Examiner* — Duy Deo
*Assistant Examiner* — Maki Angadi
(74) *Attorney, Agent, or Firm* — Greer Burns & Crain, Ltd.

(57) ABSTRACT

A wafer processing method for forming a via hole in a wafer. The wafer processing method includes a filament forming step of applying a pulsed laser beam to the wafer, the pulsed laser beam having a transmission wavelength to the wafer, in the condition where the focal point of the pulsed laser beam is set inside the wafer in a subject area where the via hole is to be formed, thereby forming an amorphous filament inside the wafer in the subject area, and an etching step of etching the amorphous filament formed inside the wafer by using an etching agent to thereby form the via hole inside the wafer.

6 Claims, 5 Drawing Sheets

WAFER PROCESSING METHOD

BACKGROUND OF THE INVENTION

1. Field of the Invention

The present invention relates to a wafer processing method for forming a via hole in a wafer such as a semiconductor wafer.

2. Description of the Related Art

In a semiconductor device fabrication process, a plurality of crossing division lines called streets are formed on the front side of a substantially disk-shaped wafer to thereby partition a plurality of regions where devices such as ICs and LSIs are respectively formed. The semiconductor wafer is cut along the streets to thereby divide the regions where the devices are formed from each other, thus obtaining individual semiconductor chips.

For the purposes of achieving smaller sizes and higher functionality of equipment, a module structure having the following configuration is in practical use. This module structure is such that a plurality of devices are stacked and bonding pads provided on these stacked devices are connected to each other. In this module structure, via holes are formed in a semiconductor wafer at positions corresponding to the bonding pads, and a conductive material such as copper is embedded in each via hole so as to be connected to the corresponding bonding pad (see Japanese Patent Laid-open No. 2003-163323, for example).

Generally, each via hole in the semiconductor wafer mentioned above is formed by using a drill. However, the diameter of each via hole in the semiconductor wafer is 90 to 300 μm, so that the formation of each via hole by using a drill causes a reduction in productivity. To solve this problem, there has been proposed a hole forming method for a wafer composed of a substrate and a plurality of devices formed on the front side of the substrate, a plurality of bonding pads being formed on each device, wherein a pulsed laser beam is applied to the substrate from the back side thereof to thereby efficiently form a plurality of via holes respectively reaching the plural bonding pads (see Japanese Patent Laid-open Nos. 2007-67082 and 2007-330985, for example).

SUMMARY OF THE INVENTION

However, in applying the pulsed laser beam to the substrate from the back side thereof to thereby form the via holes respectively reaching the bonding pads, it is difficult to stop the application of the pulsed laser beam at the time each via hole formed in the substrate has reached the corresponding bonding pad, causing a problem that the bonding pads may be melted to be perforated by the pulsed laser beam.

Further, in applying the pulsed laser beam to the substrate from the back side thereof to thereby form the via holes respectively reaching the bonding pads, there is another problem such that annular debris having a width of about 10 μm and a height of 20 to 30 μm may be deposited like a crater around the opening of each via hole on the back side of the substrate, causing a degradation in quality of each device. Further, in the case that an insulating film having a thickness of about 10 μm of epoxy resin or the like is formed on the back side of the substrate, there arises another problem such that the debris deposited on the back side of the substrate may penetrate the insulating film, causing a degradation in quality of each device.

It is therefore an object of the present invention to provide a wafer processing method which can efficiently form a via hole in a wafer without the generation of debris.

In accordance with an aspect of the present invention, there is provided a wafer processing method for forming a via hole in a wafer, including a filament forming step of applying a pulsed laser beam to the wafer, the pulsed laser beam having a transmission wavelength to the wafer, in the condition where the focal point of the pulsed laser beam is set inside the wafer in a subject area where the via hole is to be formed, thereby forming an amorphous filament inside the wafer in the subject area; and an etching step of etching the amorphous filament formed inside the wafer by using an etching agent to thereby form the via hole inside the wafer.

Preferably, the pulsed laser beam to be applied in the filament forming step is focused by a focusing lens, and the numerical aperture (NA) of the focusing lens is set in the range of 0.1 to 0.3.

According to the wafer processing method of the present invention, an amorphous filament is first formed inside the wafer and this amorphous filament is next etched to be formed into a via hole. Accordingly, no debris is generated to thereby eliminate a degradation in quality of each device. Further, the via hole can be efficiently formed.

Further, the etching agent for selectively etching the amorphous filament is used in the etching step. Accordingly, in the case of forming a via hole communicating with a bonding pad formed of metal, the bonding pad of metal is not etched by this etching agent, thereby solving the problem that a hole is formed in the bonding pad.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
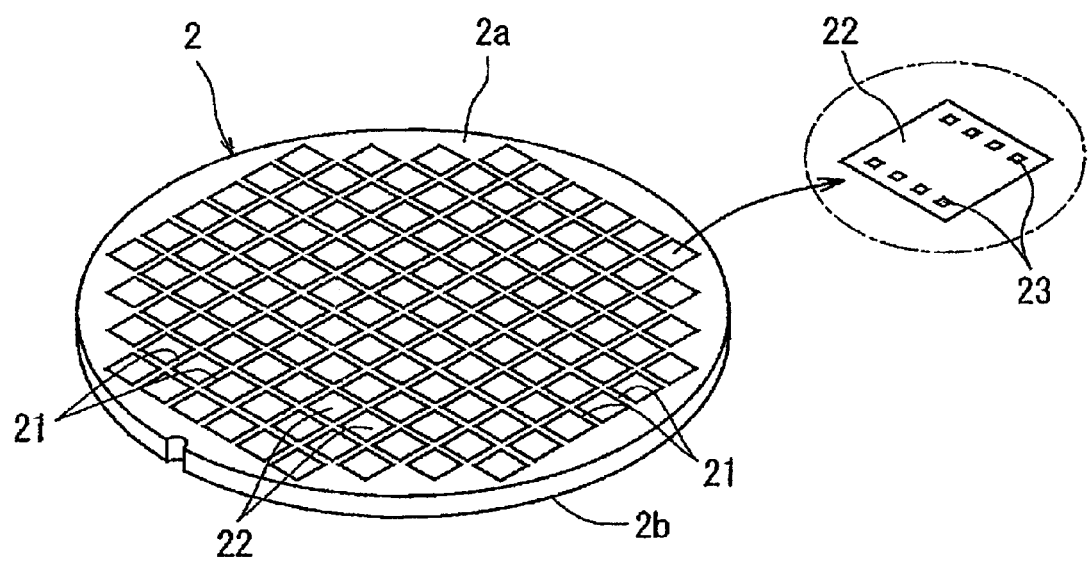
FIG. 1 is a perspective view of a semiconductor wafer to be processed by the wafer processing method according to the present invention.

The wafer processing method according to the present invention will now be described in more detail with reference to the attached drawings. FIG. 1 is a perspective view of a semiconductor wafer 2 as a wafer to be processed by the wafer processing method according to the present invention. The semiconductor wafer 2 shown in FIG. 1 is formed from a silicon substrate having a thickness of 300 μm, for example. A plurality of crossing division lines 21 are formed on a front side 2a of the silicon substrate, i.e., the front side of the semiconductor wafer 2 to thereby define a plurality of separate regions where a plurality of devices 22 such as ICs and LSIs are respectively formed. All of the devices 22 have the same configuration. A plurality of bonding pads 23 are formed on the front side of each device 22. Each bonding pad 23 is formed of a metal material such as aluminum, copper, gold, platinum, and nickel. Each bonding pad 23 has a thickness of 1 to 5 μm. In this preferred embodiment, the interval of the bonding pads 23 is set to 1 mm.

Figure 2A:
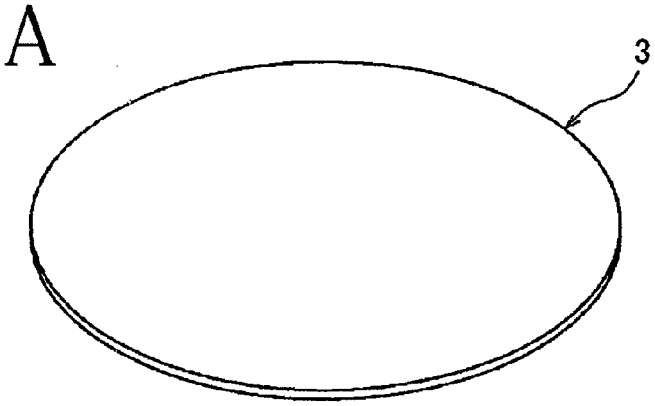
FIGS. 2A and 2B are perspective views for illustrating a protective member attaching step.
Figure 2A:
Figure 2A:
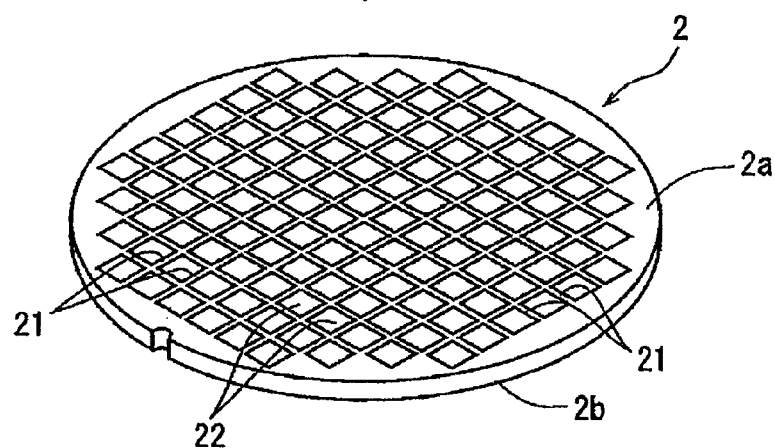
Figure 2B:
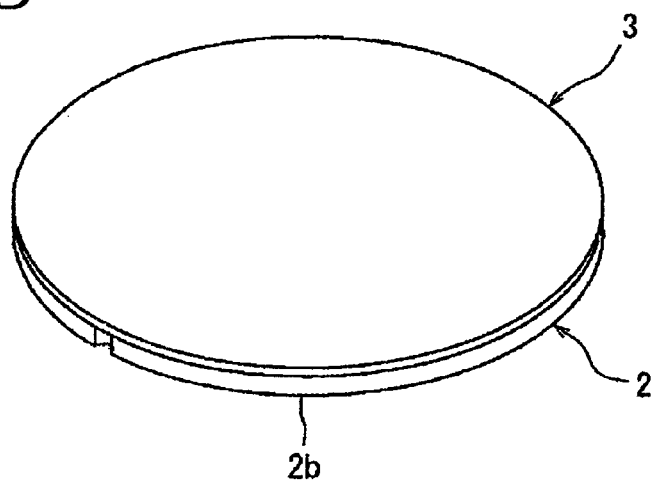

There will now be described a wafer processing method for forming a via hole inside the semiconductor wafer 2 at a position corresponding to each bonding pad 23 in each device 22. First, a protective member attaching step is performed in such a manner that a protective member is attached to the front side 2a of the semiconductor wafer 2 to protect the devices 22 formed on the front side 2a of the semiconductor wafer 2. More specifically, as shown in FIGS. 2A and 2B, a protective tape 3 as the protective member is attached to the front side 2a of the semiconductor wafer 2. The protective tape 3 is composed of a base sheet and an adhesive layer formed on the base sheet. For example, the base sheet has a thickness of 100 μm and it is formed of polyvinyl chloride (PVC). The adhesive layer has a thickness of about 5 μm and it is formed of acrylic resin.

Figure 3:
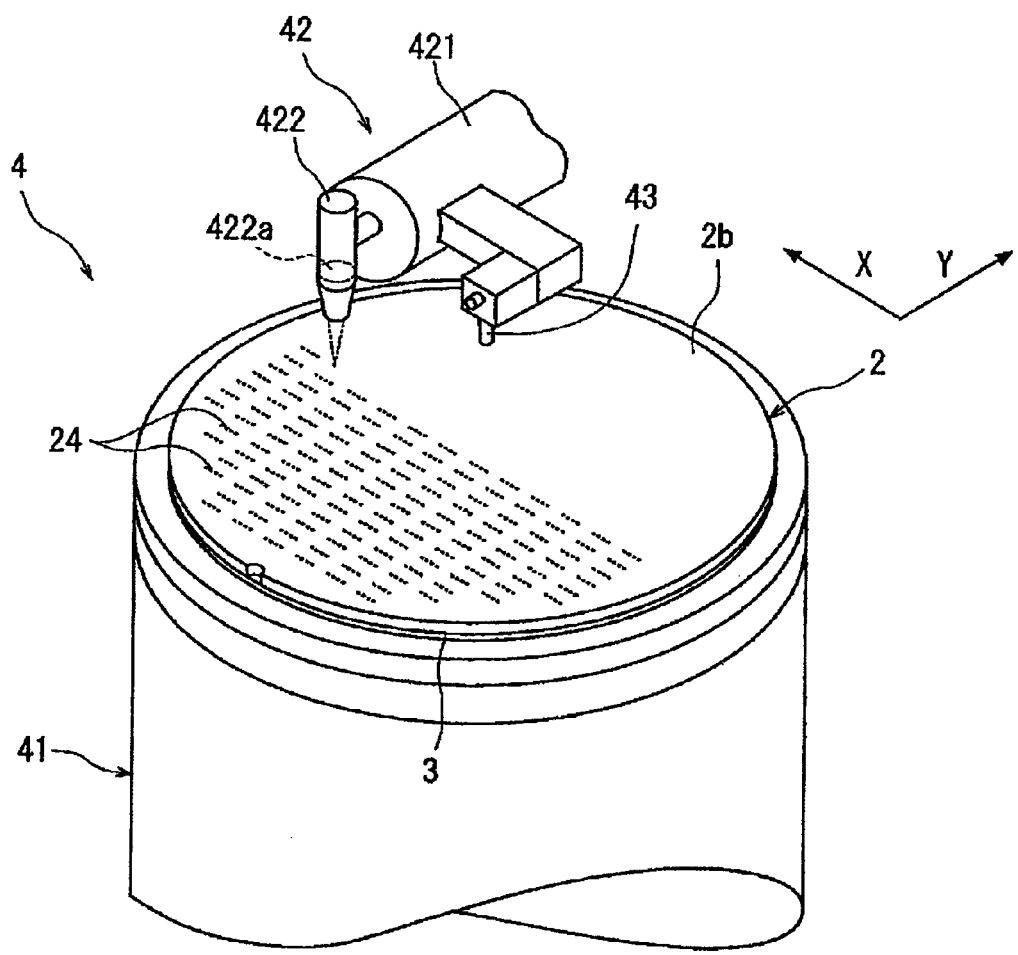
FIG. 3 is a perspective view of an essential part of a laser processing apparatus for performing a filament forming step.

After performing the protective member attaching step mentioned above, a filament forming step is performed in such a manner that a pulsed laser beam having a transmission wavelength to the wafer is applied to the wafer in the condition where the focal point of the pulsed laser beam is set inside the wafer in a subject area where the via hole is to be formed, thereby forming an amorphous filament inside the wafer in this subject area. This filament forming step is performed by using a laser processing apparatus 4 shown in FIG. 3. As shown in FIG. 3, the laser processing apparatus 4 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam oscillating means including a pulsed laser beam oscillator and repetition frequency setting means. The laser beam applying means 42 further includes focusing means 422 mounted on the front end of the casing 421. The focusing means 422 has a focusing lens 422a for focusing a pulsed laser beam oscillated by the pulsed laser beam oscillating means. It is important that the numerical aperture (NA) of the focusing lens 422a of the focusing means 422 is set in the range of 0.1 to 0.3. In this preferred embodiment, the numerical aperture (NA) of the focusing lens 422a is set to 0.25. The laser beam applying means 42 further includes focal position adjusting means (not shown) for adjusting the focal position of the pulsed laser beam to be focused by the focusing means 422.

The imaging means 43 is mounted on a front end portion of the casing 421 constituting the laser beam applying means 42 and includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 43 is transmitted to control means (not shown).

There will now be described with reference to FIG. 3 and FIGS. 4A and 4B the filament forming step of applying a pulsed laser beam having a transmission wavelength to the silicon substrate constituting the semiconductor wafer 2 by using the laser processing apparatus 4 mentioned above in the condition where the focal point of the pulsed laser beam is set inside the wafer 2 in a subject area where the via hole is to be formed, thereby forming an amorphous filament inside the wafer 2 in this subject area. First, the semiconductor wafer 2 is placed on the chuck table 41 of the laser processing apparatus 4 in the condition where the protective tape 3 attached to the front side 2a of the semiconductor wafer 2 is in contact with the chuck table 41 as shown in FIG. 3. Thereafter, suction means (not shown) is operated to hold the semiconductor wafer 2 through the protective tape 3 on the chuck table 41 under suction (wafer holding step). Accordingly, the back side 2b of the semiconductor wafer 2 held on the chuck table 41 is oriented upward. Thereafter, the chuck table 41 holding the semiconductor wafer 2 is moved to a position directly below the imaging means 43 by operating the feeding means (not shown).

In the condition where the chuck table 41 is positioned directly below the imaging means 43, the semiconductor wafer 2 held on the chuck table 41 is set in a predetermined coordinate position. In this condition, an alignment operation is performed to determine whether or not the crossing division lines 21 formed on the semiconductor wafer 2 held on the chuck table 41 are parallel to the X direction and the Y direction (alignment step). That is, the semiconductor wafer 2 held on the chuck table 41 is imaged by the imaging means 43 and image processing such as pattern matching is performed to thereby carry out the alignment operation. The front side 2a of the semiconductor wafer 2 held on the chuck table 41 is oriented downward, so that the division lines 21 formed on the front side 2a are not exposed. However, the division lines 21 can be imaged from the back side 2b of the semiconductor wafer 2 because the imaging means 43 includes the infrared light applying means for applying infrared light, the optical system for capturing the infrared light applied, and the imaging device (infrared CCD) for outputting an electrical signal corresponding to the infrared light captured as described above.

By performing the alignment step mentioned above, the semiconductor wafer 2 held on the chuck table 41 is set in the predetermined coordinate position. Data on design coordinate positions of the plural bonding pads 23 formed on each device 22 formed on the front side 2a of the semiconductor wafer 2 is preliminarily stored in the control means (not shown) included in the laser processing apparatus 4.

Figure 4A:
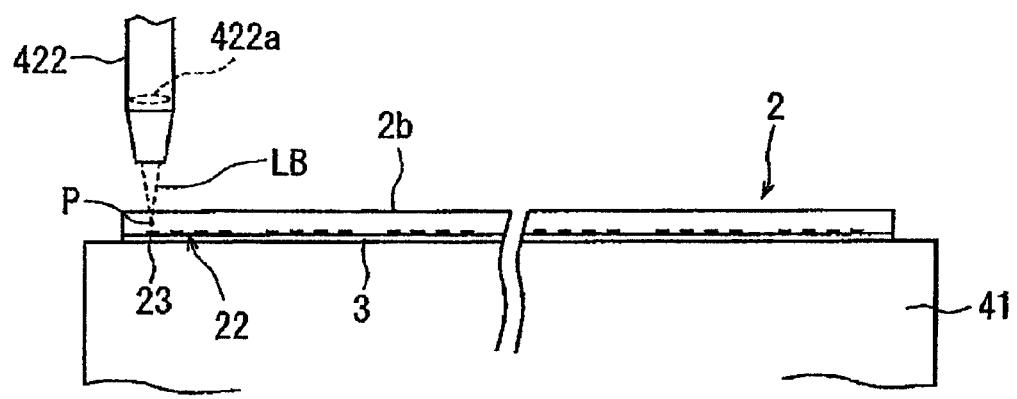
FIGS. 4A and 4B are views for illustrating the filament forming step.

After performing the alignment step mentioned above, the chuck table 41 is moved so that a leftmost one of the plural devices 22 arranged in a first direction on the semiconductor wafer 2 as viewed in FIG. 4A is positioned directly below the focusing means 422. Further, a leftmost one of the plural bonding pads 23 formed on the leftmost device 22 as viewed in FIG. 4A is positioned directly below the focusing means 422.

Thereafter, the focal point P of a pulsed laser beam LB to be applied from the focusing means 422 is set at an intermediate position in the direction along the thickness of the semiconductor wafer 2. In this preferred embodiment, the focal point P of the pulsed laser beam LB is set at a position below the back side 2b (upper surface) of the semiconductor wafer 2 by 160 μm, wherein the pulsed laser beam LB is to be applied to the back side 2b of the wafer 2. Thereafter, one pulse of the pulsed laser beam LB having a transmission wavelength to the silicon substrate is applied from the focusing means 422 to the wafer 2 (filament forming step).

For example, the filament forming step mentioned above is performed under the following processing conditions.

Wavelength: 1030 nm
Repetition frequency: 50 kHz
Pulse width: 10 ps
Average power: 3 W
Numerical aperture (NA) of the focusing lens: 0.25
Focused spot diameter: 10 μm
Focus: −160 μm (defocused on the laser beam applied surface)

Figure 4B:
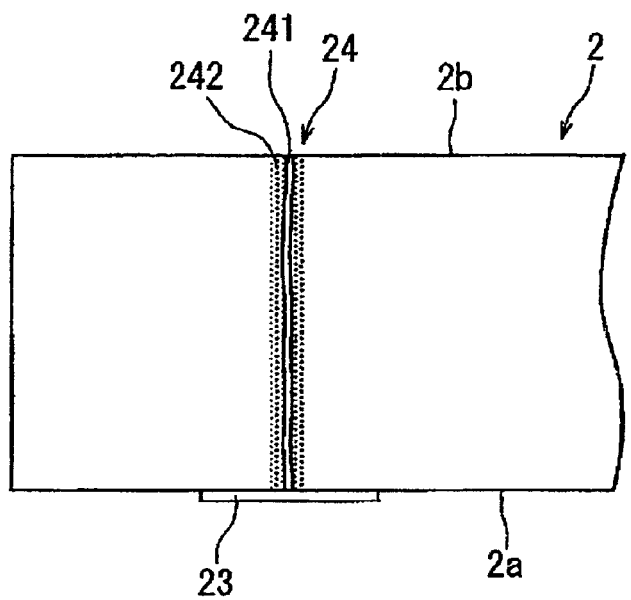

By performing the filament forming step under the above-mentioned processing conditions, an amorphous filament 24 is formed inside the semiconductor wafer 2 so as to extend from the back side 2b (upper surface) to the front side 2a (lower surface), so that the amorphous filament 24 reaches the bonding pad 23 formed on the front side 2a of the wafer 2 as shown in FIG. 4B. The amorphous filament 24 is composed of a central fine hole 241 and an amorphous layer 242 formed around the central fine hole 241 as shown in FIG. 4B. As mentioned above, the amorphous filament 24 formed by the filament forming step mentioned above extends from the laser beam applied surface (upper surface) of the semiconductor wafer 2 to the lower surface thereof. Accordingly, even when the thickness of the wafer 2 is large, it is sufficient to once apply the pulsed laser beam LB, so that the productivity can be greatly improved.

Thereafter, the filament forming step mentioned above is similarly performed for subject areas where via holes corresponding to all of the other bonding pads 23 are to be formed. As a result, a plurality of amorphous filaments 24 are similarly formed inside the semiconductor wafer 2 in the subject areas where the via holes corresponding to all of the other bonding pads 23 are to be formed.

Figure 5A:
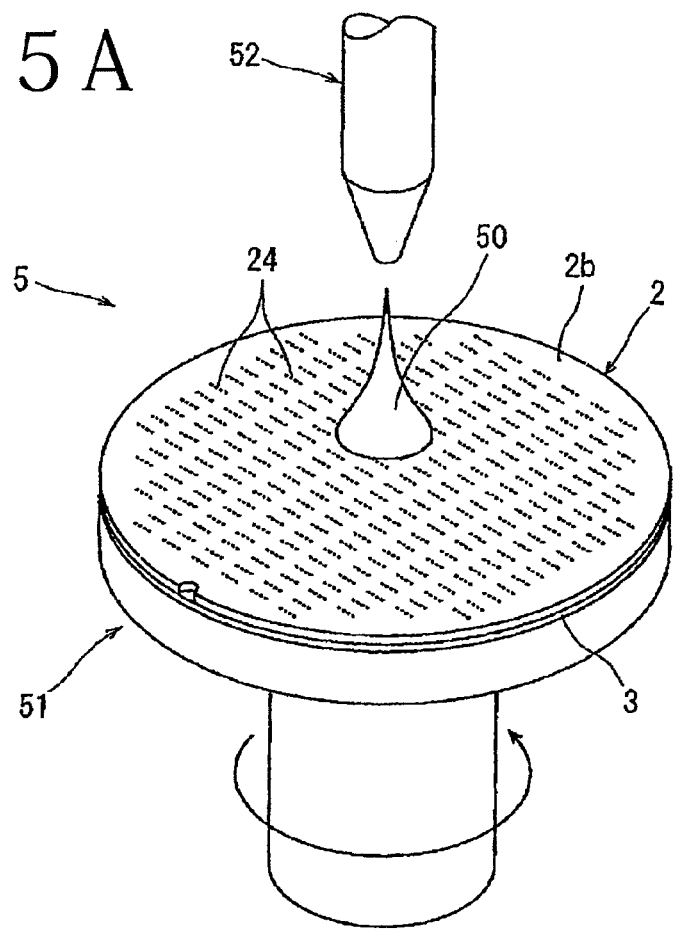
FIGS. 5A and 5B are views for illustrating an etching step.

After finishing the filament forming step mentioned above, an etching step is performed in such a manner that the amorphous filaments 24 formed inside the semiconductor wafer 2 by the filament forming step are etched by using an etching agent to thereby form the via holes inside the semiconductor wafer 2. This etching step is performed by using an etching apparatus 5 shown in FIG. 5A. As shown in FIG. 5A, the etching apparatus 5 includes a chuck table 51 for holding a workpiece under suction and an etching agent nozzle 52 for supplying an etching agent 50 in the form of a liquid to the workpiece held on the chuck table 51. In performing the etching step by using the etching apparatus 5, the semiconductor wafer 2 processed by the filament forming step is first placed on the chuck table 51 of the etching apparatus 5 in the condition where the protective tape 3 attached to the front side 2a of the wafer 2 is in contact with the upper surface of the chuck table 51 as shown in FIG. 5A. Thereafter, suction means (not shown) is operated to hold the semiconductor wafer 2 through the protective tape 3 on the chuck table 51 (wafer holding step). Accordingly, the back side 2b of the semiconductor wafer 2 held on the chuck table 51 is oriented upward. Thereafter, the chuck table 51 is rotated at a speed of 10 to 60 rpm, for example, and the etching agent 50 for etching the filaments 24 formed inside the semiconductor wafer 2 is supplied from the etching agent nozzle 52 during the rotation of the chuck table 51. Examples of the etching agent 50 include hydrofluoric acid and the mixture of hydrofluoric acid and nitric acid in the case that the semiconductor wafer 2 is formed from a silicon substrate as in this preferred embodiment. In the case that the wafer in the present invention is formed from a sapphire substrate, hydrofluoric acid or concentrated sulfuric acid may be used. In the case that the wafer in the present invention is formed from a glass substrate, hydrofluoric acid or potassium hydroxide (KOH) may be used.

Figure 5B:
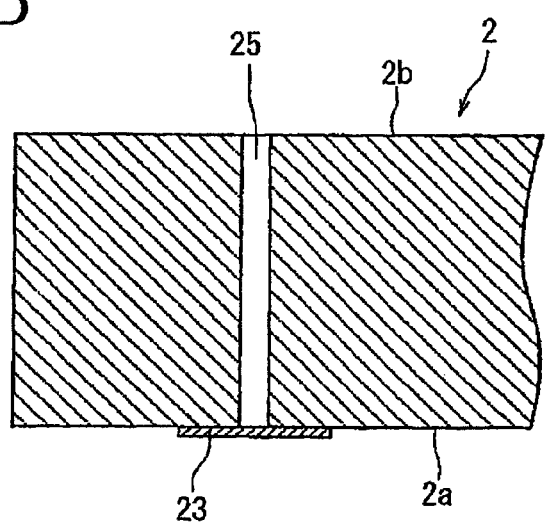

When the etching agent 50 is supplied from the etching agent nozzle 52 onto the back side 2b of the semiconductor wafer 2 held on the chuck table 51 in the condition where the chuck table 51 is rotated, the etching agent 50 quickly penetrates into the amorphous filaments 24 formed inside the wafer 2, thereby etching the amorphous filaments 24. As a result, each amorphous filament 24 is etched off to thereby form a via hole 25 extending from the back side 2b of the semiconductor wafer 2 to the corresponding bonding pad 23 formed on the front side 2a of the wafer 2 as shown in FIG. 5B. For example, the via hole 25 has a diameter of about 30 μm.

As described above, the amorphous filaments 24 formed inside the semiconductor wafer 2 are etched off in the etching step mentioned above, thereby forming the via holes 25 respectively corresponding to the bonding pads 23. Accordingly, no debris is generated to thereby eliminate a degradation in quality of each device. Further, the etching agent 50 (hydrofluoric acid or the mixture of hydrofluoric acid and nitric acid) is used to selectively etch the filaments 24 in the etching step mentioned above, so that the bonding pads 23 formed of metal are not etched by the etching agent 50, thereby solving the problem that a hole is formed in each bonding pad.

Further, while the back side 2b of the semiconductor wafer 2 is also etched by the etching agent 50 in the above etching step, the etch rate for the back side 2b is about 1/10 of the etch rate for the amorphous filaments 24. That is, the back side 2b of the semiconductor wafer 2 is slightly etched and there is no problem. After performing the etching step mentioned above, each via hole 25 reaching the corresponding bonding pad 23 formed on the front side 2a of the semiconductor wafer 2 is filled with metal such as copper.

While a specific preferred embodiment of the present invention has been described above, the present invention is not limited to the above preferred embodiment, but various modifications may be made within the scope of the present invention. For example, while the semiconductor wafer 2 formed from a silicon substrate is processed to form the via holes 25 inside the wafer 2 in the above preferred embodiment, the wafer in the present invention may be formed from a sapphire substrate or a glass substrate. Also in each case, the effects mentioned above can be obtained. Further, while the etching step in the above preferred embodiment is wet etching using the etching agent 50 in the form of a liquid, plasma etching using $SF_6$ or $C_4F_8$ may be performed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for forming a via hole in a wafer having a first side and a second side opposite to the first side, comprising:

a filament forming step of applying a pulsed laser beam to said wafer from the second side thereof, said pulsed laser beam having a transmission wavelength to said wafer, in a condition where the focal point of said pulsed laser beam is set inside said wafer in a subject area where said via hole is to be formed, thereby forming an amorphous filament inside said wafer in said subject area, said amorphous filament including a central fine hole extending from the second side to the first side of said wafer and an amorphous layer surrounding the central fine hole; and an etching step of etching said amorphous filament formed inside said wafer by using an etching agent to thereby form said via hole inside said wafer.

2. The wafer processing method according to claim 1, wherein said pulsed laser beam to be applied in said filament forming step is focused by a focusing lens, and the numerical aperture (NA) of said focusing lens is set in the range of 0.1 to 0.3.

3. The wafer processing method according to claim 1, wherein said wafer includes a plurality of bonding pads on the first side thereof.

4. The wafer processing method according to claim 3, wherein said etching step does not result in the etching agent etching a hole in said bonding pads.

5. The wafer processing method according to claim 3, wherein said bonding pads are formed of metal.

6. The wafer processing method according to claim 1, wherein said via hole has a diameter of approximately 30 μm.

\* \* \* \* \*